(12) United States Patent
Kawakami et al.

(10) Patent No.: US 7,781,767 B2
(45) Date of Patent: Aug. 24, 2010

(54) THIN FILM TRANSISTOR SUBSTRATE AND DISPLAY DEVICE

(75) Inventors: Nobuyuki Kawakami, Kobe (JP); Hiroshi Gotoh, Kobe (JP); Aya Hino, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 11/743,916

(22) Filed: May 3, 2007

(65) Prior Publication Data

US 2007/0278497 A1   Dec. 6, 2007

(30) Foreign Application Priority Data

May 31, 2006   (JP) .............. 2006-152092

(51) Int. Cl.
- H01L 29/04 (2006.01)
- H01L 31/20 (2006.01)
- H01L 31/036 (2006.01)
- H01L 31/0376 (2006.01)

(52) U.S. Cl. .......................... 257/59; 257/79; 257/771; 257/E29.147; 257/E29.28

(58) Field of Classification Search ................... 257/59, 257/79, 771, E29.147, E29.28; 349/42
See application file for complete search history.

(56) References Cited

U.S. PATENT DOCUMENTS

| | | | |
|---|---|---|---|
| 5,514,909 A | 5/1996 | Yamamoto et al. | |
| 6,033,542 A | 3/2000 | Yamamoto et al. | |
| 6,096,438 A | 8/2000 | Takagi et al. | |
| 6,218,206 B1 | 4/2001 | Inoue et al. | |
| 6,252,247 B1 | 6/2001 | Sakata et al. | |
| 7,098,539 B2 | 8/2006 | Gotoh et al. | |
| 7,154,180 B2 | 12/2006 | Gotoh et al. | |

(Continued)

FOREIGN PATENT DOCUMENTS

CN   1719320   1/2006

(Continued)

OTHER PUBLICATIONS

U.S. Appl. No. 12/126,527, filed May 23, 2008, Hino, et al.

(Continued)

*Primary Examiner*—Cuong Q Nguyen
*Assistant Examiner*—Cathy N Lam
(74) *Attorney, Agent, or Firm*—Oblon, Spivak, McClelland, Maier & Neustadt, L.L.P.

(57) ABSTRACT

Disclosed are a thin film transistor substrate where barrier metal can be omitted to be formed between a semiconductor layer of a thin film transistor and source and drain electrodes (barrier metal need not be formed between the semiconductor layer of the thin film transistor and the source and drain electrodes), and a display device. (1) A thin film transistor substrate has a semiconductor layer of a thin film transistor, a source electrode, a drain electrode, and a transparent conductive film, wherein the substrate has a structure in which the source and drain electrodes are directly connected to the semiconductor layer of the thin film transistor, and the source and drain electrodes include an Al alloy thin film containing Ni of 0.1 to 6.0 atomic percent, La of 0.1 to 1.0 atomic percent, and Si of 0.1 to 1.5 atomic percent. (2) A display device has the thin film transistor substrate.

5 Claims, 2 Drawing Sheets

U.S. PATENT DOCUMENTS

| | | | |
|---|---|---|---|
| 7,365,810 B2 | 4/2008 | Gotoh et al. | |
| 2003/0047812 A1 | 3/2003 | Hagihara et al. | |
| 2004/0171200 A1* | 9/2004 | Maeda et al. | 438/149 |
| 2005/0224795 A1 | 10/2005 | Gotoh et al. | |
| 2005/0285109 A1* | 12/2005 | Kim | 257/59 |
| 2006/0007366 A1* | 1/2006 | Gotoh et al. | 349/42 |
| 2006/0091792 A1 | 5/2006 | Kugimiya et al. | |
| 2006/0180250 A1 | 8/2006 | Kugimiya et al. | |
| 2006/0181198 A1 | 8/2006 | Gotoh et al. | |
| 2006/0237849 A1 | 10/2006 | Gotoh et al. | |
| 2006/0275618 A1 | 12/2006 | Kugimiya et al. | |
| 2007/0040172 A1 | 2/2007 | Kawakami et al. | |
| 2007/0040173 A1 | 2/2007 | Kugimiya et al. | |
| 2008/0081532 A1 | 4/2008 | Okuno | |
| 2008/0121522 A1 | 5/2008 | Ehira et al. | |
| 2008/0223718 A1 | 9/2008 | Takagi et al. | |

FOREIGN PATENT DOCUMENTS

| | | |
|---|---|---|
| JP | 01-134426 | 5/1989 |
| JP | 11-283934 | 10/1999 |
| JP | 11-284195 | 10/1999 |
| JP | 11-337976 | 12/1999 |
| JP | 2003-273109 | 9/2003 |
| JP | 2005-317579 | 11/2005 |
| KR | 2002-0089982 | 11/2002 |

OTHER PUBLICATIONS

U.S. Appl. No. 12/131,444, filed Jun. 2, 2008, Gotou.
U.S. Appl. No. 12/131,493, filed Jun. 2, 2008, Gotou, et al.
U.S. Appl. No. 12/136,409, filed Jun. 10, 2008, Ochi, et al.
U.S. Appl. No. 12/172,442, filed Jul. 14, 2008, Takagi, et al.
U.S. Appl. No. 12/355,274, filed Jan. 16, 2009, Kugimiya, et al.
U.S. Appl. No. 12/415,379, filed Mar. 31, 2009, Takagi, et al.
U.S. Appl. No. 12/414,877, filed Mar. 31, 2009, Takagi, et al.
U.S. Appl. No. 12/312,907, filed Jun. 1, 2009, Gotou, et al.
U.S. Appl. No. 12/517,362, filed Jun. 3, 2009, Hino, et al.
U.S. Appl. No. 12/528,008, filed Aug. 20, 2009, Gotou, et al.

* cited by examiner

THIN FILM TRANSISTOR SUBSTRATE AND DISPLAY DEVICE

BACKGROUND OF THE INVENTION

1. Field of the Invention

The present invention belongs to a technical field in connection with a thin film transistor substrate and a display device.

2. Description of Related Art

In a display device of an active matrix type such as a liquid crystal display, thin film transistor (hereinafter, sometimes called TFT) is used as a switching element. A schematic diagram of a TFT element is shown in FIG. 2. The TFT element includes a gate electrode formed on a glass substrate, a non-doped semiconductor silicon layer provided via a gate insulating film, and impurity-doped semiconductor silicon layers contacted to the non-doped semiconductor silicon layer. Electrical connection with the respective impurity-doped semiconductor silicon layers is made using wiring metal including Al alloy. The wiring metal is referred to as a source electrode or a drain electrode. The drain electrode is further connected with a transparent conductive film used in a liquid crystal display section. As the wiring metal (source electrode or drain electrode), various Al alloys have been proposed (for example, JP-A-7-45555 and JP-A-2005-171378). In such electrical connection, a structure is used, in which a stacked film including high melting point metal such as Mo, Cr, Ti, or W is interposed as barrier metal between the wiring metal and the TFT element (semiconductor silicon layer), or between the wiring metal and the transparent conductive film (hereinafter, sometimes called ITO film) used in the liquid crystal display section to prevent direct contact between them.

Hitherto, various proposals have been made on a technique for omitting the barrier metal between the wiring metal and the ITO film as seen in JP-A-2004-214606, JP-A-2005-303003, and JP-A-2006-23388. However, a technique for omitting the barrier metal between the wiring metal and the TFT element (semiconductor silicon layer) has not been sufficiently investigated.

[Patent literature 1] JP-A-2004-214606
[Patent literature 2] JP-A-2005-303003
[Patent literature 3] JP-A-2006-23388

SUMMARY OF THE INVENTION

The reason for interposing the barrier metal between the wiring metal (source electrode or drain electrode) and the TFT element (silicon layer) is to prevent a bad effect on the TFT element when pure Al or Al alloy configuring the wiring is directly contacted to the semiconductor layer of the TFT element. Amorphous silicon or polycrystalline silicon is used for the semiconductor layer. A generation mechanism of the bad effect on the TFT element is as follows.

That is, when the wiring (pure Al or Al alloy) and the semiconductor layer (for example, silicon) are subjected to a heating step such as CVD (Chemical Vapor Deposition) forming, sintering, or annealing in a manufacturing process of TFT in a condition that they are directly contacted to each other, aluminum atoms (Al atoms) in wiring may be thermally diffused into the semiconductor silicon, or silicon atoms (Si atoms) may be thermally diffused from the semiconductor silicon layer into the pure Al or Al alloy in wiring. When Al atoms are thermally diffused into the semiconductor silicon, semiconductor performance of the semiconductor silicon is significantly deteriorated. This induces increase in leak current, decrease in on-current, reduction in switching speed and the like, consequently desired switching performance is hardly obtained. Similarly, when Si atoms are diffused into wiring, semiconductor performance of the silicon semiconductor is deteriorated, consequently deterioration in switching performance is induced. That is, display performance or quality of a display is reduced.

The barrier metal is effective for suppressing interdiffusion between Al atoms and Si atoms. However, on the other hand, a barrier metal formation step is indispensable for forming such a structure. That is, a deposition apparatus for forming the barrier metal is additionally necessary in addition to a deposition apparatus necessary for forming Al wiring. As reduction in cost of the liquid crystal display and the like is advanced due to increase in production, increase in manufacturing cost involved by formation of the barrier metal cannot be neglected.

Under the above-described condition, the present invention aims to provide a thin-film transistor substrate in which the barrier metal can be omitted to be formed between the semiconductor layer of the thin film transistor and the source and drain electrodes (the barrier metal need not be formed between the semiconductor layer of the thin film transistor and the source and drain electrodes), and provide a display device.

The inventors made earnest study to achieve the above desirableness, as a result, completed the invention. According to an embodiment of the invention, the above desirableness can be achieved.

An embodiment of the invention relates to a thin film transistor substrate and a display device, and includes four modes of thin film transistor substrates (thin film transistor substrates according to first to fourth aspects described hereafter), and one mode of display device (display device according to a fifth aspect described hereafter), which are configured as follows.

That is, a first aspect of thin film transistor substrate has a semiconductor layer of a thin film transistor, a source electrode, a drain electrode, and a transparent conductive film, wherein the substrate has a structure in which the source and drain electrodes are directly connected to the semiconductor layer of the thin film transistor, and the source and drain electrodes include an Al alloy thin film containing Ni of 0.1 to 6.0 atomic percent, La of 0.1 to 1.0 atomic percent, and Si of 0.1 to 1.5 atomic percent.

A second aspect of thin film transistor substrate includes the first mode of thin film transistor substrate further having a structure in which the drain electrode is directly connected to the transparent conductive film.

A third aspect of thin film transistor substrate includes the first or second mode of thin film transistor substrate, in which the semiconductor layer includes polycrystalline silicon.

A fourth aspect of thin film transistor substrate corresponds to any one of first to third modes of thin film transistor substrates, in which the Al alloy thin film is formed by a sputtering method.

A fifth aspect of display device has any one of the first to fourth aspects of thin film transistor substrates as a thin film transistor substrate.

According to an embodiment of the invention, the barrier metal can be omitted to be formed between a semiconductor layer of a thin film transistor and source and drain electrodes. That is, the barrier metal need not be formed between the semiconductor layer of the thin film transistor and the source and the drain electrodes.

BRIEF DESCRIPTION OF THE DRAWINGS

FIGS. 1A to 1E are diagrams showing an outline of a preparation process of an evaluation element (pn-junction element) according to an example, wherein FIG. 1A shows a polycrystalline film formed on a p-type low-resistivity Si substrate, FIG. 1B shows a condition of $BF^{2+}$ ion implantation into the polycrystalline silicon film, FIG. 1C shows a p-type polycrystalline silicon film formed by annealing the polycrystalline silicon film after being subjected to $BF^{2+}$ ion implantation, FIG. 1D shows an n-type polycrystalline silicon film formed on the p-type polycrystalline silicon film, and FIG. 1E shows the evaluation element (pn-junction element) formed by forming an Al alloy film on the n-type polycrystalline silicon film, then etching the Al alloy film.

DESCRIPTION OF THE PREFERRED EMBODIMENT

Figure 1A:
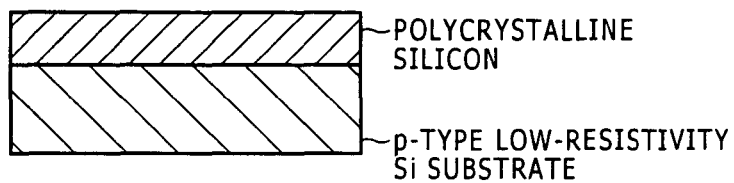
Figure 1B:
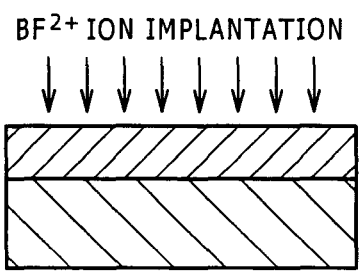
Figure 1C:
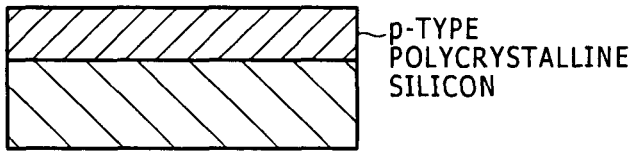
Figure 1D:
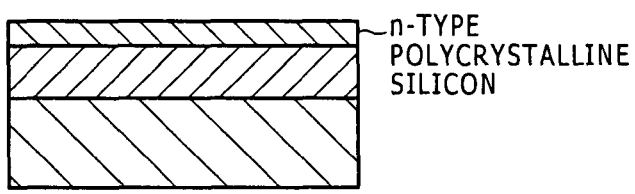

The inventors prepared evaluation elements using thin films including Al being added with various chemical elements, and investigated properties of Al/Si interdiffusion (interdiffusion between Al atoms and Si atoms), electrical resistivity, and hillock resistance. As a result, they found that Ni, Si or La was effectively added into Al to improve the properties.

It is known that when Al is added with Si, an effect of suppressing interdiffusion between Al atoms and Si atoms is improved with increase in added amount of Al. On the other hand, when the element is singly used (when only Si is added), an upper limit of temperature at which the Al/Si interdiffusion can be suppressed is limited to be at most about 250° C. However, it was found that when an Al—Si alloy was further added with Ni (Al was added with Si, and further added with Ni), so that an Al alloy containing Si and Ni was formed, the Al/Si interdiffusion was able to be suppressed even at higher temperature.

A mechanism of suppressing the interdiffusion is considered as follows. First, Si is effectively contained to prevent diffusion of Si atoms from the Si semiconductor layer into the Al film. That is, the same kinds of atoms as Si atoms are previously added into the Al film, thereby concentration difference, which is driving force of diffusion, can be decreased. Moreover, Ni is considered to be effectively contained because Ni forms a diffusion prevention layer at an interface between the Al alloy film and the Si semiconductor layer (Al-alloy-film/Si-semiconductor-layer interface). That is, Ni easily reacts with Si and produces silicide at low temperature. It is considered that once the silicide is produced, a silicide layer act as a barrier which prevents further progress of interdiffusion. It is considered that remarkable improvement is given from a multiplication effect of them, consequently the Al/Si interdiffusion can be suppressed even at a higher temperature.

While a film including Al—Si—Ni alloy can suppress the Al/Si interdiffusion even at a higher temperature, the film has not sufficient hillock resistance. However, it was found that hillock resistance was improved by further adding La into the Al—Si—Ni alloy.

Merits are given by adding the chemical elements, that is, the Al/Si interdiffusion can be suppressed, and hillock resistance of the Al alloy film is improved. However, on the other hand, a difficulty is given, that is, when such elements are increased to be added, electrical resistivity of wiring is also increased. The content of Ni, La and Si needs to be specified to be Ni of 0.1 to 6.0 atomic percent, La of 0.1 to 1.0 atomic percent, and Si of 0.1 to 1.5 atomic percent so that the Al/Si interdiffusion is suppressed, and hillock resistance of the Al alloy film is improved, in addition, the electrical resistivity is kept low. More preferably, Ni is 0.15 to 5.0 atomic percent, La is 0.15 to 0.8 atomic percent, and Si is 0.1 to 1.0 atomic percent.

An embodiment of the invention, which was completed based on such knowledge, relates to a thin film transistor substrate and a display device. In the thin film transistor substrate and the display device according to an embodiment of the invention being completed in this way, first, the thin film transistor substrate according to an embodiment of the invention has a semiconductor layer of a thin film transistor, a source electrode, a drain electrode, and a transparent conductive film, wherein the substrate has a structure in which the source electrode and the drain electrode (hereinafter, sometimes called source/drain electrode) are directly connected to the semiconductor layer of the thin film transistor, and the source electrode and the drain electrode include an Al alloy thin film containing Ni of 0.1 to 6.0 atomic percent, La of 0.1 to 1.0 atomic percent, and Si of 0.1 to 1.5 atomic percent.

In the thin film transistor substrate according to an embodiment of the invention, which has the structure in which the source/drain electrode is directly connected to the semiconductor layer of the thin film transistor, since the source/drain electrode includes the Al alloy thin film containing Ni of 0.1 to 6.0 atomic percent, La of 0.1 to 1.0 atomic percent, and Si of 0.1 to 1.5 atomic percent, as known from the knowledge, the Al/Si interdiffusion can be suppressed, and hillock resistance of the Al alloy film is improved, in addition, the electrical resistivity of the Al alloy thin film can be kept low.

As known from the above, in the thin film transistor substrate according to an embodiment of the invention, the substrate has the structure in which the source/drain electrode is directly connected to the semiconductor layer of the thin film transistor, preventing hindrance in properties. That is, even if the barrier metal is not formed between the semiconductor layer of the thin film transistor and the source/drain electrode, the Al/Si interdiffusion can be suppressed, in addition, hillock resistance of the Al alloy thin film is improved, and the electrical resistivity of the Al alloy thin film can be kept low.

Therefore, according to the thin film transistor substrate according to an embodiment of the invention, the barrier metal can be omitted to be formed between the semiconductor layer of the thin film transistor and the source/drain electrode. That is, the barrier metal need not be formed between the semiconductor layer of the thin film transistor and the source/drain electrode (source electrode and drain electrode).

In the thin film transistor substrate according to an embodiment of the invention, the content of Ni, La and Si is specified to be Ni of 0.1 to 6.0 atomic percent, La of 0.1 to 1.0 atomic percent, and Si of 0.1 to 1.5 atomic percent (hereinafter, sometimes called at %). The reason for this is described below.

The reason why Si is specified to be 0.1 to 1.5 at % is that when Si is less than 0.1 at %, the effect of suppressing the Al/Si interdiffusion is reduced, consequently the Al/Si interdiffusion is insufficiently suppressed, and when Si is more than 1.5 at %, electrical resistivity is increased, consequently electrical resistivity cannot be kept low. The reason why Ni is specified to be 0.1 to 6.0 at % is that when Ni is less than 0.1 at %, the effect of suppressing the Al/Si interdiffusion is reduced, consequently the Al/Si interdiffusion is insufficiently suppressed, and when Ni is more than 6.0 at %, electrical resistivity is increased, consequently electrical resistivity cannot be kept low. The reason why La is specified to be 0.1 to 1.0 at % is that when La is less than 0.1 at %, the effect of improving hillock resistance is reduced, consequently hillock resistance becomes insufficiently, and when La is more than 1.0 at %, electrical resistivity is increased, consequently electrical resistivity cannot be kept low.

In the thin film transistor substrate according to an embodiment of the invention, since the drain electrode includes the Al alloy having the composition as described above, the substrate may have a structure in which the drain electrode is directly connected not only to the semiconductor layer of the thin film transistor, but also to the transparent conductive film (second aspect). This is because the drain electrode has low contact resistance largely due to containing Ni.

Since the start temperature of Al/Si interdiffusion is further increased in the case that the semiconductor layer includes polycrystalline silicon, semiconductor layer desirably includes polycrystalline silicon (third aspect). An embodiment of the invention can be applied to a case of continuous grain silicon similarly as the case of the polycrystalline silicon.

The Al alloy thin film of the source/drain electrode is desirably formed by a sputtering method (fourth aspect). That is, while a formation method of the Al alloy thin film of the source/drain electrode is not particularly limited, the sputtering method is desirably used in forming the thin film. This is because a desired composition can be easily obtained by controlling a composition of a target to be used in the sputtering method.

The thin film transistor substrate according to an embodiment of the invention can be used in various electronic devices, and for example, can be used for a thin film transistor substrate of a display device (fifth aspect).

EXAMPLES

Hereinafter, examples of the invention and a comparative example are described. The invention is not limited to the examples, and can be carried out with being appropriately altered and modified within a scope suitable for the purport of the invention, and all of such alterations and modifications are included in a technical scope of the invention.

Evaluation elements (pn-junction elements) according to the examples of the invention and the comparative example were prepared. A process flow is shown in FIGS. 1A to 1E. A preparation method is described below.

As shown in FIG. 1, first, a polycrystalline silicon film 200 nm in thickness was formed on a p-type low-resistivity silicon substrate by an LPCVD method (FIG. 1A). At that time, $SiH_4$ was used for a source gas. Then, the film was subjected to ion implantation of $BF^{2+}$ ions at a condition of 10 keV and $3 \times 10^{15}/cm^2$ (FIG. 1B). Then, such an ion-implanted film was subjected to annealing at 800° C. for 30 min to be formed into a p-doped polycrystalline silicon film (FIG. 1C). Then, an n-doped polycrystalline silicon film about 40 nm in thickness was formed thereon (FIG. 1D). At that time, $SiH_4$ and $PH_3$ as a doping gas were used for deposition. Thus, a pn-junction of polycrystalline silicon was formed.

Figure 1E:
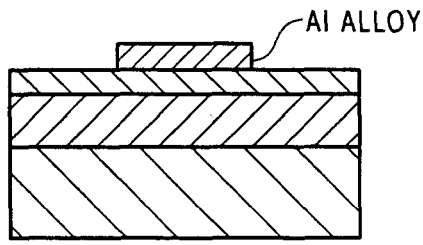
Figure 2:
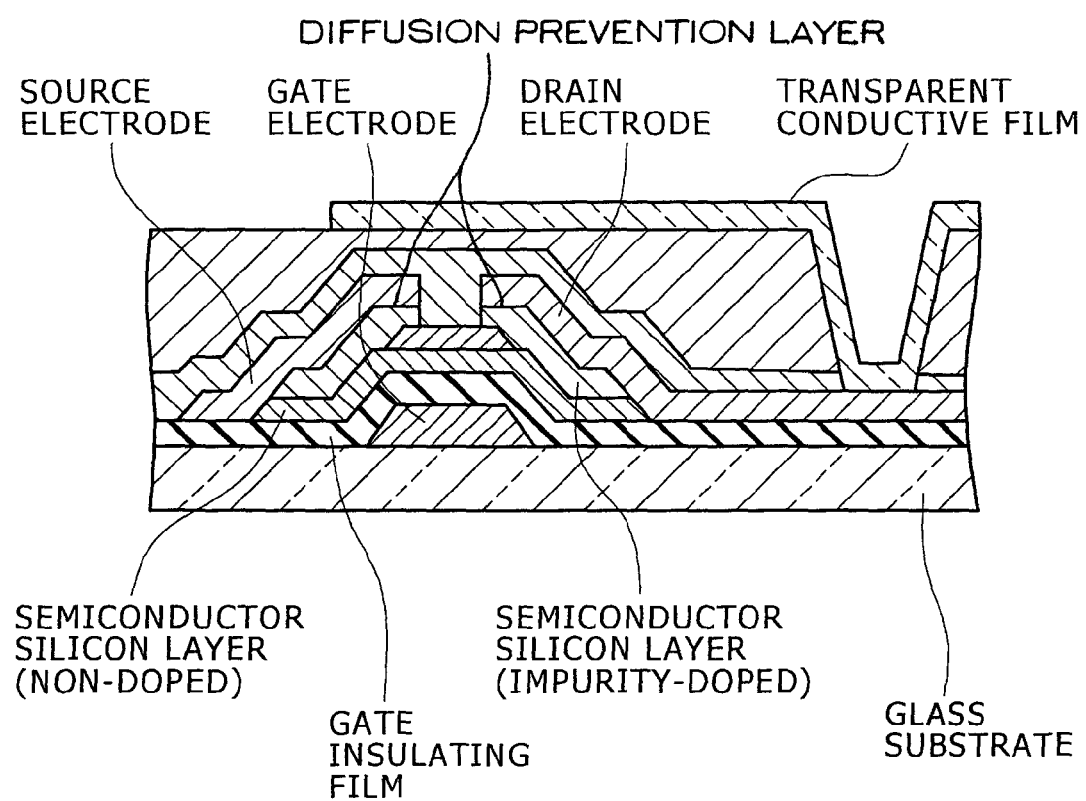
FIG. 2 is a schematic diagram showing an outline of a TFT (thin film transistor) element.

Then, an Al alloy film about 300 nm in thickness was deposited on the polycrystalline silicon film. Then, a resist pattern was formed by photolithography, and then the Al alloy film was etched with the resist as a mask, thereby a shown evaluation element was formed (FIG. 1E). A composition of the Al alloy film is as shown in a column of source/drain electrode of Table 1. In the evaluation element shown in FIG. 1E, the Al alloy film corresponds to the source/drain electrode, and the n-type polycrystalline silicon film and the p-type polycrystalline silicon film in a portion (portion shown in FIG. 1D) under the Al alloy film correspond to the semiconductor layer of the thin film transistor. The source/drain electrode (Al alloy film) and the semiconductor layer of the thin film transistor are in a structure of being directly connected to each other with the barrier metal being not interposed.

The evaluation element (pn-junction element) prepared in this way was subjected to annealing at a temperature of 250 to 400° C. for 30 min. Then, the annealed pn-junction element was investigated in a level of interdiffusion between Al atoms and Si atoms by measuring a current-voltage characteristic. That is, a diffusion phenomenon between Si atoms in the polycrystalline silicon (semiconductor layer) and Al atoms in the Al alloy film (source/drain electrode) can be evaluated by measuring the current-voltage characteristic of the pn-junction element. An element having a normal pn-junction has a rectification property that a current is flown by applying a negative voltage to an n-type region, and applying a positive voltage (hereinafter, called positive bias) to the p-type region, and conversely a current is interrupted by applying a positive voltage to the n-type region, and applying a negative voltage (hereinafter, called reverse bias) to a p-type region. However, when the Al atoms are diffused from the Al alloy film (source/drain electrode) into a pn-junction region, the normal rectification property cannot be obtained. That is, even if reverse bias is applied, a current cannot be interrupted. Therefore, magnitude of a current flowing during applying reverse bias (hereinafter, called leak current) is evaluated, thereby an effect of the interdiffusion between Al atoms and Si atoms can be known. Thus, a value of the leak current was measured, and a level of the interdiffusion between Al atoms and Si atoms was evaluated from a measurement value of the leak current. An evaluated element had an area size of the pn-junction region of 30 μm*30 μm, and a current value when +1 V was applied to the area as the reverse bias was defined as the leak current.

A result of such measurement is shown in a column of interdiffusion of Table 1. In an element in which Cr is interposed as the barrier metal between the source/drain electrode (Al alloy film) and the semiconductor layer of the thin film transistor, the leak current is $4.0*10^{-9}$ A. Compared with a value ($4.0*10^{-8}$ A) ten times larger than such a leak current value, a small leak current value was shown by ○ (a single circle), and a large leak current value was shown by x (a cross). That is, a leak current of $4.0*10^{-8}$ A or less was defined to be good, and a leak current of more than $4.0*10^{-8}$ A was defined to be inadequate.

Occurrence of a hillock due to annealing was evaluated as follows. Wiring in a line-and-space pattern 10 μm in width was formed on samples of the pn-junction elements, and then the samples were subjected to vacuum heat treatment at 350° C. for 30 min. Then, a wiring surface was observed by an electron microscope, and the number of hillocks having a diameter of 0.1 μm or more was counted. Hillock density of $1 \times 10^9/m^2$ or less was defined to be good (○), and hillock density of more than $1 \times 10^9/m^2$ was defined to be bad (x). A result is shown in a column of hillock resistance of Table 1.

Example 2

An Al alloy film 300 nm in thickness was deposited on a glass substrate by the sputtering method. Then, a resist pattern was formed by photolithography, and then the Al alloy film was etched with the resist as a mask to be formed into a stripe pattern shape 100 μm in width and 10 mm in length. A composition of the Al alloy film is the same as that shown in the column of source/drain electrode of Table 1.

The etched Al alloy film was subjected to annealing at a temperature of 250 to 400° C. for 30 min. Then, the annealed Al alloy film was measured in electrical resistivity by the four-terminal method. A result is shown in a column of electrical resistivity of Table 1. Electrical resistivity of 1.3 times of electrical resistivity of a pure Al film (3.3 μΩ·cm) was used as a standard (3.3*1.3=4.3 μΩ·cm). Compared with the standard, small electrical resistivity was defined to be good, and large electrical resistivity was defined to be bad.

Evaluation of Results in Examples 1 to 2

As known from Table 1, when the Al alloy film (source/drain electrode) includes Al—Si alloy, in both of the cases of annealing temperature of 250° C. and 400° C., leak current is large or inadequate (x), and the interdiffusion between Al atoms and Si atoms is insufficiently suppressed (Nos. 3 to 12). In addition, hillock resistance is bad (x) or inadequate (Nos. 3 to 12).

When the Al alloy film (source/drain electrode) includes Al—Si—Ni alloy, in both the cases of annealing temperature of 250° C. and 400° C., leak current is small or good (◯), and the interdiffusion between Al atoms and Si atoms is sufficiently suppressed. However, hillock resistance is bad (x) or inadequate (Nos. 13 to 24).

On the contrary, when the Al alloy film (source/drain electrode) includes Al—Si—Ni—La alloy, in both the cases of annealing temperature of 250° C. and 400° C., leak current is small or good (◯), and the interdiffusion between Al atoms and Si atoms is sufficiently suppressed, in addition, hillock resistance is good (◯) (Nos. 25 to 46).

Among the films of Nos. 25 to 46, in cases of No. 41 and No. 46, since each of Al alloy films has excessively large Si content, electrical resistivity is larger than the standard value ((electrical resistivity of the pure Al film)*1.3=4.3 μΩ·cm), or bad. In cases other than these, since Al alloy films satisfy the composition range of the Al alloy thin film for the thin film transistor substrate according to an embodiment of the invention, electrical resistivity is smaller than the standard value, or good (Nos. 25 to 40 and 42 to 45).

Consequently, it was confirmed that when the Al alloy film (source/drain electrode) satisfied the composition range of the Al alloy thin film of the thin film transistor substrate according to an embodiment of the invention, in both the cases of annealing temperature of 250° C. and 400° C., leak current was small or good (◯), and the interdiffusion between Al atoms and Si atoms was sufficiently suppressed, and hillock resistance was good (◯), in addition, electrical resistivity was small or good.

Example 3

Contact performance (contact resistance) when the Al alloy electrode and the transparent conductive film were directly connected to each other was investigated. Samples in which an ITO film was formed on various Al alloy electrodes as shown in Table 2 were formed at a condition of pressure of 3 mTorr and temperature of 200° C. under an Ar gas atmosphere. As the ITO film, a film of ITO including indium oxide added with tin oxide of 10 mass percent was used.

A Kelvin pattern having a contact hole in 10 μm square was prepared, and contact resistivity was measured by the four-terminal method using the Kelvin pattern. Contact resistivity of $2*10^{-4}$ Ωcm$^2$ between a Cr thin film and ITO was used as a standard value, and resistivity not more than the standard value was defined to be good (◯), and resistivity more than the standard value was defined to be bad (x). An evaluation result is shown in Table 2.

When the Al alloy electrode includes Al—Si alloy, contact resistivity is large or bad (x) (Nos. 3 to 12).

On the contrary, when the Al alloy electrode includes Al—Si—Ni—La alloy, contact resistivity is small or good (◯) (Nos. 25 to 46). In addition, when the Al alloy electrode includes Al—Si—Ni alloy, contact resistivity is small or good (◯) (Nos. 13 to 24).

TABLE 1

| No | Source/drain electrode | Leak current (A) @250° C. | Leak current (A) @400° C. | Interdiffusion @250° C. | Interdiffusion @400° C. | Hillock resistance | Electric resistivity at 400° C. (μΩ · cm) | over-all evaluation |
|---|---|---|---|---|---|---|---|---|
| 1 | Al | 3.5E−04 | >1e−2 | X | X | X | 3.3 | X |
| 2 | Cr | 3.2E−09 | 4.0E−09 | ◯ | ◯ | ◯ | 14.3 | X |
| 3 | Al-0.1 at % Si | 8.7E−04 | >1e−2 | X | X | X | 3.4 | X |
| 4 | Al-0.3 at % Si | 2.3E−05 | >1e−2 | X | X | X | 3.4 | X |
| 5 | Al-0.5 at % Si | 5.0E−06 | >1e−2 | X | X | X | 3.5 | X |
| 6 | Al-1.0 at % Si | 4.7E−07 | >1e−2 | X | X | X | 3.6 | X |
| 7 | Al-2.0 at % Si | 6.1E−08 | 2.2E−03 | X | X | X | 3.6 | X |
| 8 | Al-0.5 at % Si-0.1 at % Ni | 4.6E−09 | 3.2E−08 | ◯ | ◯ | X | 3.5 | X |
| 9 | Al-0.5 at % Si-0.5 at % Ni | 4.4E−09 | 2.8E−08 | ◯ | ◯ | X | 3.5 | X |
| 10 | Al-0.5 at % Si-1.0 at % Ni | 4.7E−09 | 2.5E−08 | ◯ | ◯ | X | 3.5 | X |
| 11 | Al-0.5 at % Si-2.0 at % Ni | 3.0E−09 | 1.5E−08 | ◯ | ◯ | X | 3.5 | X |
| 12 | Al-0.5 at % Si-4.0 at % Ni | 3.1E−09 | 8.8E−09 | ◯ | ◯ | Δ | 3.6 | X |
| 13 | Al-0.5 at % Si-6.0 at % Ni | 2.5E−09 | 5.2E−09 | ◯ | ◯ | Δ | 3.7 | X |
| 14 | Al-0.5 at % Si-1.0 at % Ni-0.05 at % La | 5.5E−09 | 3.0E−08 | ◯ | ◯ | ◯ | 3.6 | ◯ |
| 15 | Al-0.5 at % Si-1.0 at % Ni-0.1 at % La | 5.2E−09 | 3.1E−08 | ◯ | ◯ | ◯ | 3.7 | ◯ |
| 16 | Al-0.5 at % Si-1.0 at % Ni-0.5 at % La | 6.2E−09 | 3.3E−08 | ◯ | ◯ | ◯ | 3.8 | ◯ |
| 17 | Al-0.5 at % Si-1.0 at % Ni-1.0 at % La | 4.4E−09 | 2.2E−08 | ◯ | ◯ | ◯ | 4.0 | ◯ |
| 18 | Al-0.5 at % Si-1.0 at % Ni-1.5 at % La | 5.1E−09 | 1.5E−09 | ◯ | ◯ | ◯ | 4.3 | X |
| 19 | Al-1.0 at % Si-1.0 at % Ni-0.05 at % La | 1.1E−09 | 3.0E−09 | ◯ | ◯ | ◯ | 3.7 | ◯ |
| 20 | Al-1.0 at % Si-1.0 at % Ni-0.1 at % La | 9.5E−10 | 2.9E−09 | ◯ | ◯ | ◯ | 3.7 | ◯ |
| 21 | Al-1.0 at % Si-1.0 at % Ni-0.5 at % La | 1.1E−09 | 4.9E−09 | ◯ | ◯ | ◯ | 3.9 | ◯ |
| 22 | Al-1.0 at % Si-1.0 at % Ni-1.0 at % La | 2.3E−09 | 6.8E−09 | ◯ | ◯ | ◯ | 4.0 | ◯ |
| 23 | Al-0.1 at % Si-2.0 at % Ni-0.35 at % La | 5.5E−09 | 1.5E−08 | ◯ | ◯ | ◯ | 3.8 | ◯ |
| 24 | Al-0.3 at % Si-2.0 at % Ni-0.35 at % La | 7.5E−09 | 1.6E−08 | ◯ | ◯ | ◯ | 3.8 | ◯ |
| 25 | Al-0.5 at % Si-2.0 at % Ni-0.35 at % La | 3.8E−09 | 2.9E−08 | ◯ | ◯ | ◯ | 3.9 | ◯ |
| 26 | Al-1.0 at % Si-2.0 at % Ni-0.35 at % La | 3.7E−10 | 2.8E−09 | ◯ | ◯ | ◯ | 4.0 | ◯ |

TABLE 1-continued

| No | Source/drain electrode | Leak current (A) @250° C. | Leak current (A) @400° C. | Interdiffusion @250° C. | Interdiffusion @400° C. | Hillock resistance | Electric resistivity at 400° C. ($\mu\Omega \cdot cm$) | over-all evaluation |
|---|---|---|---|---|---|---|---|---|
| 27 | Al-2.0 at % Si-2.0 at % Ni-0.35 at % La | 1.4E−09 | 9.9E−09 | ○ | ○ | ○ | 4.4 | X |
| 28 | Al-0.5 at % Si-4.0 at % Ni-0.35 at % La | 2.0E−09 | 2.7E−08 | ○ | ○ | ○ | 4.0 | ○ |
| 29 | Al-0.5 at % Si-5.0 at % Ni-0.35 at % La | 2.1E−09 | 1.9E−08 | ○ | ○ | ○ | 4.1 | ○ |
| 30 | Al-0.5 at % Si-6.0 at % Ni-0.35 at % La | 2.4E−09 | 1.8E−08 | ○ | ○ | ○ | 4.2 | ○ |
| 31 | Al-0.5 at % Si-7.0 at % Ni-0.35 at % La | 1.8E−09 | 2.1E−08 | ○ | ○ | ○ | 4.4 | X |

Note:
1. In judgement on whether resistivity is good or not, 1.3 times of resistivity of pure Al, 3.3 * 1.3 = 4.3 $\mu\Omega \cdot$ cm, is used as a standard, and resistivity being not more than this is judged as NG.
2. at % means atomic percent.

TABLE 2

| No. | source/drain electrode | contact resistivity ($\Omega \cdot cm2$) | evaluation |
|---|---|---|---|
| 1 | Al | 1.0E−03 | X |
| 2 | Cr | 2.0E−04 | ○ |
| 3 | Al-0.1 at % Si | 1.0E−03 | X |
| 4 | Al-0.3 at % Si | 2.0E−03 | X |
| 5 | Al-0.5 at % Si | 2.1E−03 | X |
| 6 | Al-1.0 at % Si | 3.0E−03 | X |
| 7 | Al-2.0 at % Si | 3.0E−03 | X |
| 8 | Al-0.5 at % Si-0.1 at % Ni | 2.0E−04 | ○ |
| 9 | Al-0.5 at % Si-0.5 at % Ni | 1.0E−04 | ○ |
| 10 | Al-0.5 at % Si-1.0 at % Ni | 1.0E−04 | ○ |
| 11 | Al-0.5 at % Si-2.0 at % Ni | 9.0E−05 | ○ |
| 12 | Al-0.5 at % Si-4.0 at % Ni | 5.0E−05 | ○ |
| 13 | Al-0.5 at % Si-6.0 at % Ni | 3.0E−05 | ○ |
| 14 | Al-0.5 at % Si-1.0 at % Ni-0.05 at % La | 8.0E−05 | ○ |
| 15 | Al-0.5 at % Si-1.0 at % Ni-0.1 at % La | 8.0E−05 | ○ |
| 16 | Al-0.5 at % Si-1.0 at % Ni-0.5 at % La | 8.0E−05 | ○ |
| 17 | Al-0.5 at % Si-1.0 at % Ni-1.0 at % La | 9.0E−05 | ○ |
| 18 | Al-0.5 at % Si-1.0 at % Ni-1.5 at % La | 1.0E−04 | ○ |
| 19 | Al-1.0 at % Si-1.0 at % Ni-0.05 at % La | 9.0E−05 | ○ |
| 20 | Al-1.0 at % Si-1.0 at % Ni-0.1 at % La | 9.0E−05 | ○ |
| 21 | Al-1.0 at % Si-1.0 at % Ni-0.5 at % La | 1.0E−04 | ○ |
| 22 | Al-1.0 at % Si-1.0 at % Ni-1.0 at % La | 1.0E−04 | ○ |
| 23 | Al-0.1 at % Si-2.0 at % Ni-0.35 at % La | 9.0E−05 | ○ |
| 24 | Al-0.3 at % Si-2.0 at % Ni-0.35 at % La | 9.0E−05 | ○ |
| 25 | Al-0.5 at % Si-2.0 at % Ni-0.35 at % La | 1.0E−04 | ○ |
| 26 | Al-1.0 at % Si-2.0 at % Ni-0.35 at % La | 1.0E−04 | ○ |
| 27 | Al-2.0 at % Si-2.0 at % Ni-0.35 at % La | 9.0E−05 | ○ |
| 28 | Al-0.5 at % Si-4.0 at % Ni-0.35 at % La | 6.0E−05 | ○ |
| 29 | Al-0.5 at % Si-5.0 at % Ni-0.35 at % La | 5.0E−05 | ○ |
| 30 | Al-0.5 at % Si-6.0 at % Ni-0.35 at % La | 5.0E−05 | ○ |
| 31 | Al-0.5 at % Si-7.0 at % Ni-0.35 at % La | 4.0E−05 | ○ |

In the thin film transistor substrate according to an embodiment of the invention, the barrier metal need not be formed between the semiconductor layer of the thin film transistor and the source/drain electrode. Therefore, the thin film transistor substrate is excellent in economy, and can be preferably used for a thin film transistor substrate of a display device or the like.

What is claimed is:

1. A thin film transistor substrate comprising:
   a semiconductor layer of a thin film transistor,
   a source electrode,
   a drain electrode, and
   a transparent conductive film,
   wherein
   the substrate has a structure in which the source and drain electrodes are directly connected to the semiconductor layer of the thin film transistor,
   a diffusion prevention layer exists at an interface between the source and drain electrodes and the semiconductor layer of the thin film transistor, wherein the diffusion prevention layer comprises silicide formed by reaction of Ni and Si, and
   the source and drain electrodes are an Al alloy thin film consisting of:
   0.1 to 6.0 atomic percent Ni,
   0.1 to 1.0 atomic percent La,
   0.1 to 1.5 atomic percent Si, and
   Al.

2. The thin film transistor substrate according to claim 1:
   wherein the drain electrode is directly connected to the transparent conductive film.

3. The thin film transistor substrate according to claim 1:
   wherein the semiconductor layer includes polycrystalline silicon.

4. The thin film transistor substrate according to claim 1:
   wherein the Al alloy thin film is formed by a sputtering method.

5. A display device, comprising
   the thin film transistor substrate according to claim 1.

* * * * *